(12) United States Patent
Lu et al.

(10) Patent No.: US 12,412,837 B2
(45) Date of Patent: Sep. 9, 2025

(54) INTERCONNECT STRUCTURE INCLUDING TOPOLOGICAL MATERIAL

(71) Applicant: TAIWAN SEMICONDUCTOR MANUFACTURING COMPANY, LTD., Hsinchu (TW)

(72) Inventors: Meng-Pei Lu, Hsinchu (TW); Shin-Yi Yang, Hsinchu (TW); Cian-Yu Chen, Hsinchu (TW); Yun-Chi Chiang, Hsinchu (TW); Ming-Han Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 664 days.

(21) Appl. No.: 17/716,485

(22) Filed: Apr. 8, 2022

(65) Prior Publication Data
US 2023/0326857 A1  Oct. 12, 2023

(51) Int. Cl.
*H01L 23/532* (2006.01)
*H01L 21/768* (2006.01)
*H01L 23/522* (2006.01)
*H01L 23/528* (2006.01)

(52) U.S. Cl.
CPC .. *H01L 23/53271* (2013.01); *H01L 21/76807* (2013.01); *H01L 21/7682* (2013.01); *H01L 21/76885* (2013.01); *H01L 23/5226* (2013.01); *H01L 23/5283* (2013.01); *H01L 23/53209* (2013.01); *H01L 23/53295* (2013.01); *H01L 21/76831* (2013.01); *H01L 21/76846* (2013.01)

(58) Field of Classification Search
CPC ......... H01L 23/53271; H01L 21/76807; H01L 21/7682; H01L 21/76885; H10N 50/10; H10N 50/80; H10N 50/01; H10N 52/00; H10N 52/01
See application file for complete search history.

(56) References Cited

U.S. PATENT DOCUMENTS

| | | | | |
|---|---|---|---|---|
| 5,693,568 A | * | 12/1997 | Liu | H01L 21/76897 438/618 |
| 2002/0155693 A1 | * | 10/2002 | Hong | H01L 21/76885 438/618 |
| 2020/0083333 A1 | * | 3/2020 | Yang | H10D 84/0186 |
| 2020/0161535 A1 | * | 5/2020 | Lin | G11C 11/1675 |
| 2022/0157733 A1 | * | 5/2022 | Chen | H01L 21/76831 |
| 2022/0285435 A1 | * | 9/2022 | Lee | H10B 61/22 |

\* cited by examiner

*Primary Examiner* — Zandra V Smith
*Assistant Examiner* — John M Parker
(74) *Attorney, Agent, or Firm* — Birch, Stewart, Kolasch & Birch, LLP

(57) ABSTRACT

A semiconductor device includes a substrate and an interconnect layer disposed over the substrate. The interconnect layer includes an interconnect structure which includes a topological material. The topological material includes a topological insulator, a topological semimetal, or a combination thereof. A method for manufacturing the semiconductor device is also disclosed.

20 Claims, 13 Drawing Sheets

INTERCONNECT STRUCTURE INCLUDING TOPOLOGICAL MATERIAL

BACKGROUND

The integration density of various electronic components, such as transistors, diodes, resistors, capacitors, etc., is being improved continuously in the semiconductor industry by continual reduction in minimum feature size. As the feature size decreases, the dimensions of interconnects (i.e., metal lines and/or via contacts) for interconnecting these electronic components are scaled down as well. However, such interconnects would suffer high resistance problems when the dimensions thereof are scaled down.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
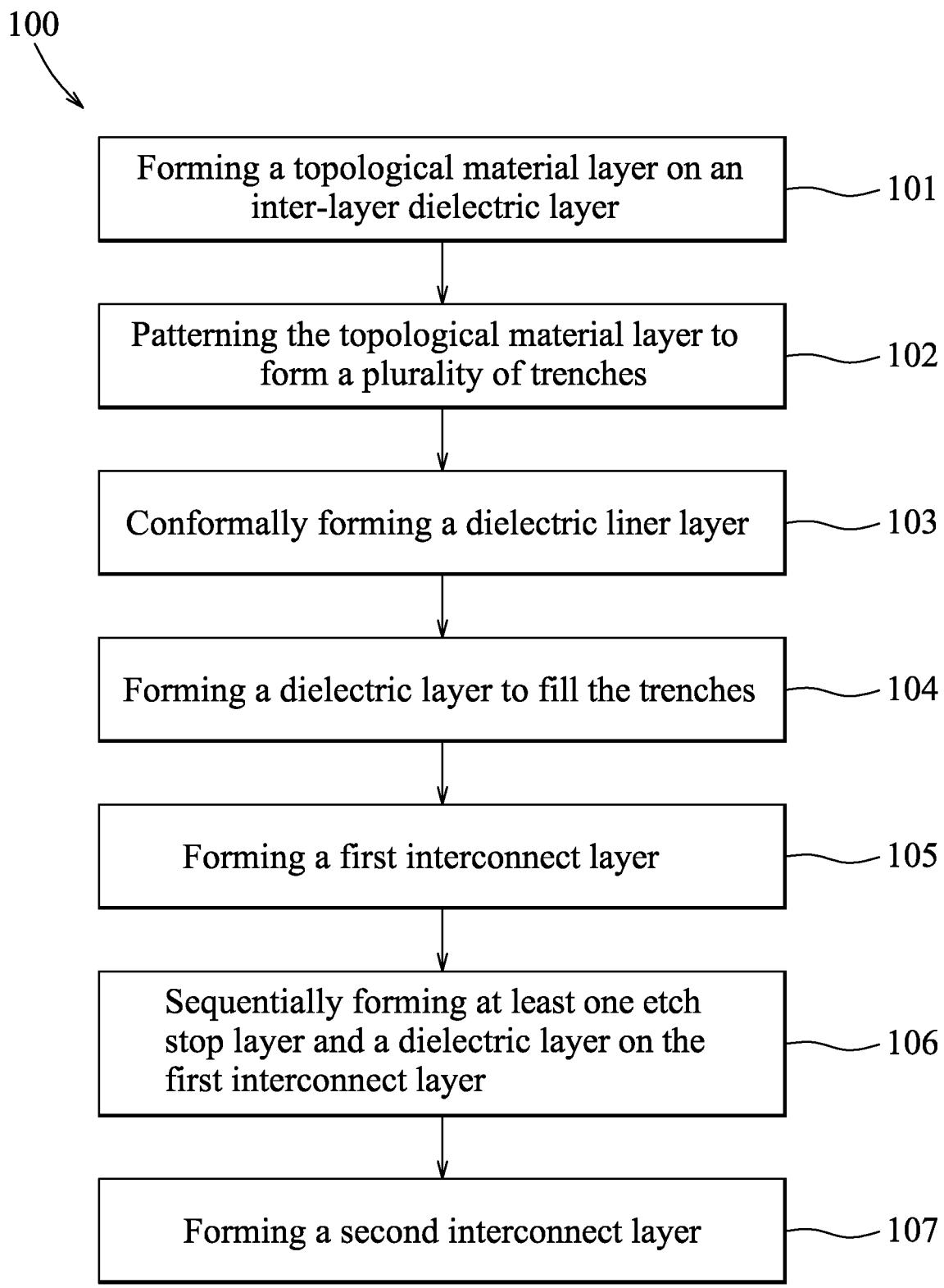
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "below," "upper," "lower," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device including an interconnect layer formed with an interconnect structure including a topological material, and a method for manufacturing the same. FIG. 1 illustrates a method 100 for manufacturing a semiconductor device in accordance with some embodiments. FIGS. 2 to 12 are schematic views of a semiconductor device 200 at some intermediate stages of the manufacturing method as depicted in FIG. 1 in accordance with some embodiments. Additional steps can be provided before, after or during the method 100, and some of the steps described herein may be replaced by other steps or be eliminated. Similarly, further additional features may be present in the semiconductor device 200, and/or features present may be replaced or eliminated in additional embodiments.

Figure 2:
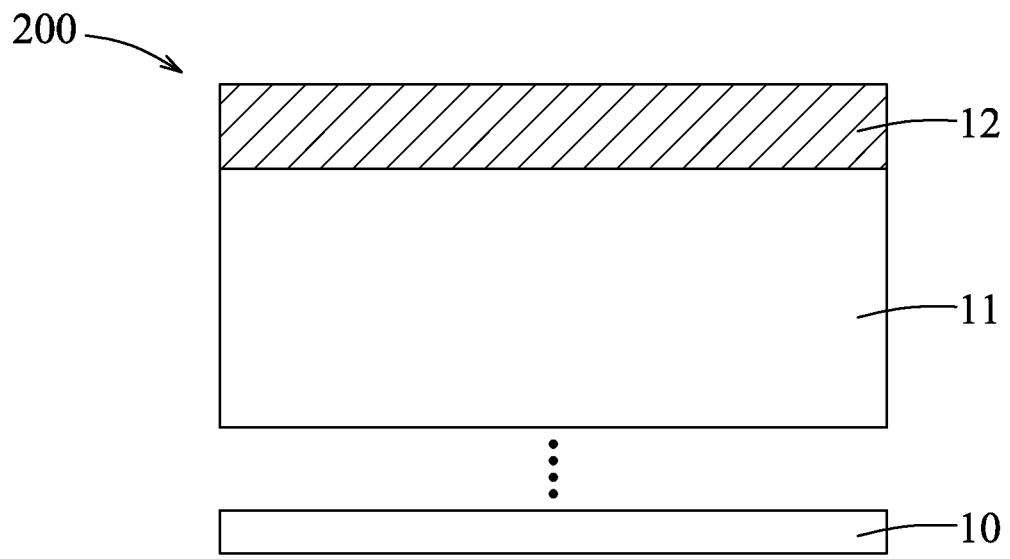
FIGS. 2 to 12 are schematic views illustrating some intermediate stages of the manufacturing method as depicted in FIG. 1 in accordance with some embodiments.

Referring to FIG. 1 and the example illustrated in FIG. 2, the method 100 begins at step 101, where a topological material layer is formed on an inter-layer dielectric layer. FIG. 2 is a schematic view illustrating formation of a topological material layer 12 on an inter-layer dielectric (ILD) layer 11 disposed over a substrate 10.

In some embodiments, the substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorous (P), or arsenic (As). Other suitable materials are within the contemplated scope of the present disclosure. In some embodiments, the semiconductor substrate may further include various active regions, for example, the active regions configured for an N-type metal oxide semiconductor transistor device (NMOS) or the active regions configured for a P-type metal oxide semiconductor transistor device (PMOS).

In some embodiments, the ILD layer 11 may include dielectric materials, such as silicon oxide (SiOx), silicon nitride (SiNx), silicon carbide (SiCx), silicon oxycarbide (SiOxCy), silicon oxynitride (SiOxNy), hydrogenated silicon oxycarbide (SiOxCyHz), spin-on glass (SOG), amorphous fluorinated carbon, fluorinated silica glass (FSG), Xerogel, Aerogel, polyimide, Parylene, BCB (bis-benzocyclobutenes), Flare, SiLK (Dow Chemical Co., Midland, Mich.), non-porous materials, porous materials, other low-k dielectric materials, or combinations thereof. Other suitable materials are within the contemplated scope of the present disclosure. In some embodiments, the ILD layer 11 may have a k-value ranging from about 1 to about 5. In some embodiments, the ILD layer 11 may be formed by a suitable deposition process known to those skilled in the art of semiconductor fabrication, for example, but not limited to, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), or low-pressure chemical vapor deposition (LPCVD). Other suitable techniques for forming the ILD layer 11 are within the contemplated scope of the present disclosure. In some embodiments, the ILD layer 11 may be formed with at least one interconnect (e.g., a via contact, not shown) for interconnecting an interconnect structure to be formed from the topological material layer 12 with a conductive feature (not shown) disposed below the ILD layer 11.

In some embodiments, the topological material layer 12 may include a topological insulator, a topological semimetal, or a combination thereof. The topological insulator is a material which behaves as an insulator in its bulk, but which has a conductive state at the surface thereof, meaning that electrons can only move along the surface of the topological material. In some embodiments, the topological insulator may include, for example, but not limited to, bismuth telluride ($Bi_2Te_3$), antimony telluride ($Sb_2Te_3$), bismuth-antimony alloys ($Bi_{1-x}Sb_x$), bismuth selenide ($Bi_2Se_3$), other bismuth (Bi)-based chalcogenides possessing a bulk band gap and a conductive surface state, or the like, or combinations thereof. Other suitable materials are within the contemplated scope of the present disclosure. The topological semimetal has a phase of matter analogous to the topological insulator but with non-insulating band structures, and is a material which behaves as a conductor in its bulk and which has a conductive state at the surface thereof as well. In some embodiments, the topological semimetal may include, for example, but not limited to, niobium phosphide (NbP), tantalum arsenide (TaAs), niobium arsenide (NbAs), tantalum phosphide (TaP), tungsten ditelluride ($WTe_2$), molybdenum ditelluride ($MoTe_2$), tungsten diphosphide ($WP_2$), molybdenum diphosphide ($MoP_2$), cadmium arsenide ($Cd_3As_2$), platinum stannide ($PtSn_4$), lanthanum antimonide (LaSb), lanthanum bismuthide (LaBi), platinum bismuthide ($PtBi_2$), zirconium pentatelluride ($ZrTe_5$), hafnium pentatelluride ($HfTe_5$), lead tantalum selenide ($PbTaSe_2$), zirconium silicon sulfide (ZrSiS), hafnium silicide sulfide (HfSiS), niobium arsenide ($NbAs_2$), tantalum arsenide ($TaAs_2$), other material systems possessing topological protected conductive surface states, or the like, or combinations thereof. Other suitable materials are within the contemplated scope of the present disclosure. In some embodiments, the topological material may be doped with a magnetic material to improve the transport properties of an interconnect structure to be formed from the topological material layer 12. In some embodiments, the magnetic material may include, for example, but not limited to, cobalt (Co), iron (Fe), nickel (Ni), or the like, or combinations thereof. Other suitable materials are within the contemplated scope of the present disclosure. The topological material layer 12 may be formed on the ILD layer 11 by a suitable deposition process known to those skilled in the art of semiconductor fabrication, for example, but not limited to, molecular beam epitaxy (MBE) deposition, PVD, MOCVD, CVD, ALD, plasma-enhanced ALD (PEALD), PECVD, or the like. Other suitable techniques for forming the topological material layer 12 are within the contemplated scope of the present disclosure. In some embodiments, the deposition process for forming the topological material layer 12 may be performed at a temperature ranging from about 25° C. to about 1000° C. If the temperature for the deposition process is higher than 1000° C., the materials and the components disposed below the topological material layer 12 may be damaged. The crystallinity of the topological material layer 12 may be single crystal, near single crystal (i.e., the topological material layer 12 has a lateral grain size much greater than a thickness thereof), highly oriented polycrystal, or polycrystal. In some embodiments, the topological material layer 12 may be subjected to an annealing process to improve the crystallinity thereof and to reduce resistivity of the interconnect structure to be formed from the topological material layer 12. In some embodiments, the annealing process may be, for example, but not limited to, a rapid thermal annealing (RTA) process, a laser process, a furnace annealing process, or the like. Other suitable annealing techniques are within the contemplated scope of the disclosure.

Figure 3:
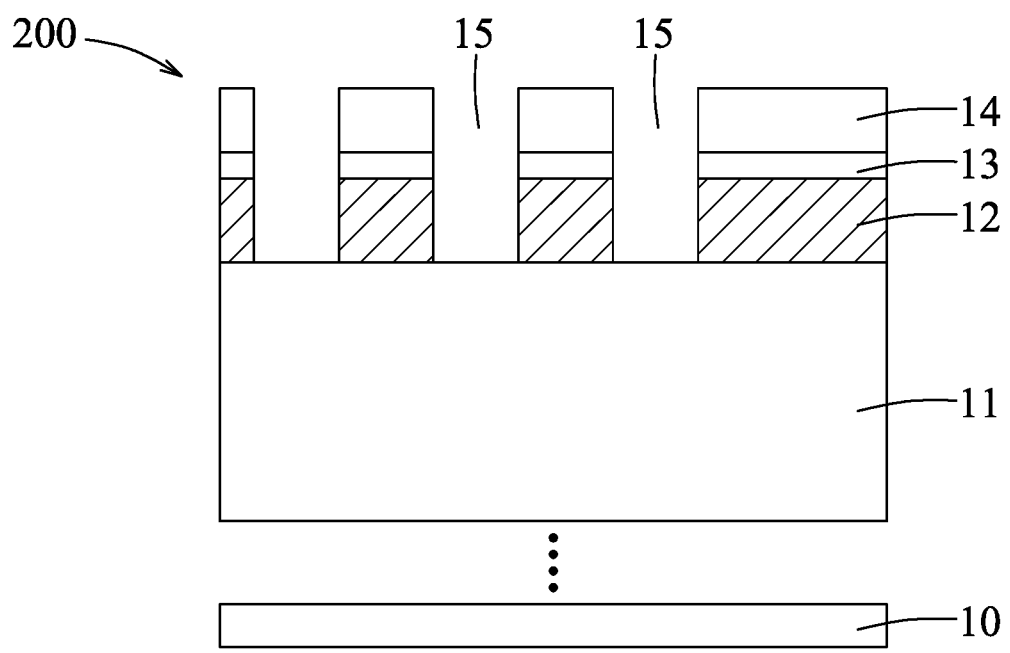

Referring to FIG. 1 and the example illustrated in FIG. 3, the method 100 then proceeds to step 102, where the topological material layer is patterned to form a plurality of trenches. A mask layer 13 (for example, a hard mask layer) is deposited on the topological material layer 12. Examples of a material suitable for forming the mask layer 13 include, for example, but not limited to, silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof. Other suitable materials are within the contemplated scope of the present disclosure. The mask layer 13 may be formed on the topological material layer 12 by a suitable deposition process as is known in the art of semiconductor fabrication, such as PVD, CVD, ALD, PEALD, thermal ALD, PECVD, or the like. Other suitable techniques are within the contemplated scope of the present disclosure. In some embodiments, the mask layer 13 has a thickness ranging from about 1 nanometer (nm) to about 1000 nm. If the thickness is less than 1 nm, the mask layer 13 may not be formed as a continuous film. If the thickness is greater than 1000 nm, the cost for forming the mask layer 13 is increased undesirably. A dielectric layer 14 may be optionally formed on the mask layer 13 to improve the flatness of the mask layer 13. The material and the process for forming the dielectric layer 14 may be the same as or similar to those for forming the ILD layer 11 described above with reference to FIG. 2, and the details thereof are omitted for the sake of brevity. A photoresist layer (not shown) is then formed on the dielectric layer 14 by a suitable fabrication technique known to those skilled in the art of semiconductor fabrication, for example, but not limited to, a spin-on technique. Other suitable techniques are within the contemplated scope of the present disclosure. The photoresist layer is then patterned using a suitable photolithography technique to form a pattern of recesses. For example, the photoresist layer is exposed to light for patterning, followed by developing to form the pattern of the recesses. The pattern of the recesses formed in the photoresist layer is transferred to the dielectric layer 14 and then to the mask layer 13 using one or more etching processes, for example, but not limited to, a wet etching process, a dry etching process, a reactive ion etching process, a neutral beam etching process, or the like. After the pattern of the recesses is transferred to the mask layer 13, the photoresist layer may be removed by, for example, but not limited to, an ashing process. The pattern of the recesses formed in the mask layer 13 is then transferred to the topological material layer 12 using a suitable etching process, for example, but not limited to, a plasma etching process, a sputter etching process, a reactive ion etching process, a deep-reactive ion etching process, or the like, so as to pattern the topological material layer 12 and to form a plurality of trenches 15 extending through the dielectric layer 14, the mask layer 13, and the topological material layer 12 to terminate at the ILD layer 11. Other suitable etching techniques are within the contemplated scope of the present disclosure.

Figure 4:
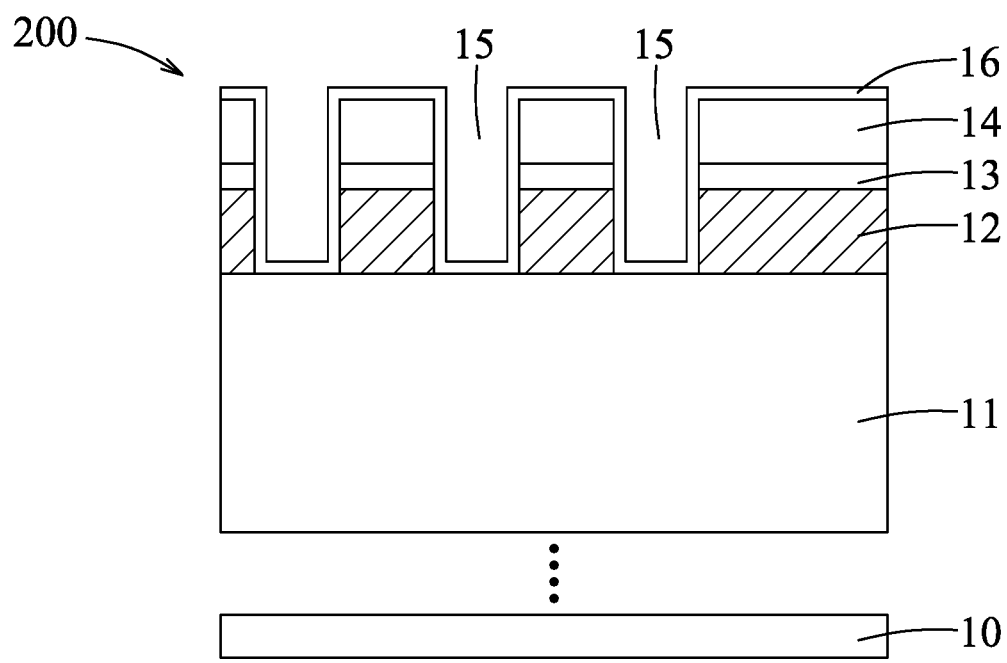

Referring to FIG. 1 and the example illustrated in FIG. 4, the method 100 then proceeds to step 103, where a dielectric liner layer is conformally formed. A dielectric liner layer 16 is conformally formed to cover the dielectric layer 14, the mask layer 13, the topological material layer 12, and the ILD layer 11 by a suitable deposition process as is known in the art of semiconductor fabrication, such as PVD, CVD, ALD, PEALD, PECVD, or the like. Other suitable techniques are within the contemplated scope of the present disclosure. In some embodiments, the dielectric liner layer 16 may include silicon oxide (SiOx), silicon carbide (SiCx), silicon nitride (SiNx), silicon oxycarbide (SiOxCy), silicon oxynitride (SiOxNy), aluminum oxide (AlOx), aluminum nitride (AlN), transition metal carbides, transition metal nitrides, transition metal oxides, or the like, or combinations thereof. Other suitable dielectric materials are within the contemplated scope of the present disclosure. In some embodiments, the dielectric liner layer 16 may have a thickness ranging from about 1 nm to about 10 nm. If the thickness is less than 1 nm, the liner/barrier properties of the dielectric liner layer 16 may be degraded. If the thickness is greater than 10 nm, the etched volume of the topological material layer 12 should be undesirably increased to provide each of the trenches 15 with a remaining volume sufficient for subsequent processing, such that the conduction volume of the interconnect structure formed from the topological material layer 12 is decreased and the resistance of the interconnect structure is increased.

Figure 5:
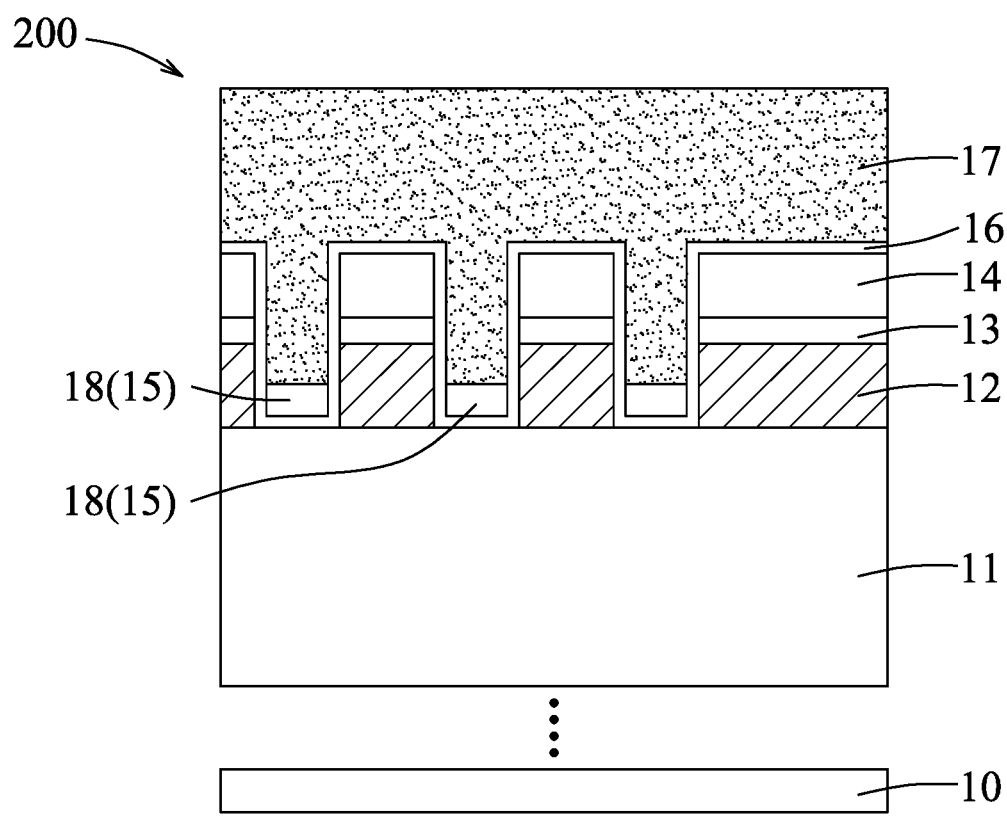

Referring to FIG. 1 and the examples illustrated in FIGS. 4 and 5, the method 100 then proceeds to step 104, where a dielectric layer is formed to fill the trenches. A dielectric layer 17 is formed by depositing a dielectric material on the dielectric liner layer 16, so as to fill the trenches 15. In some embodiments, the dielectric material and the deposition process for forming the dielectric layer 17 may be the same as or similar to those for forming the ILD layer 11 described above with reference to FIG. 2, and the details thereof are omitted for the sake of brevity. A plurality of air gaps 18 are formed accordingly as a result of incomplete filling of the dielectric layer 17 into the trenches 15.

Figure 6:
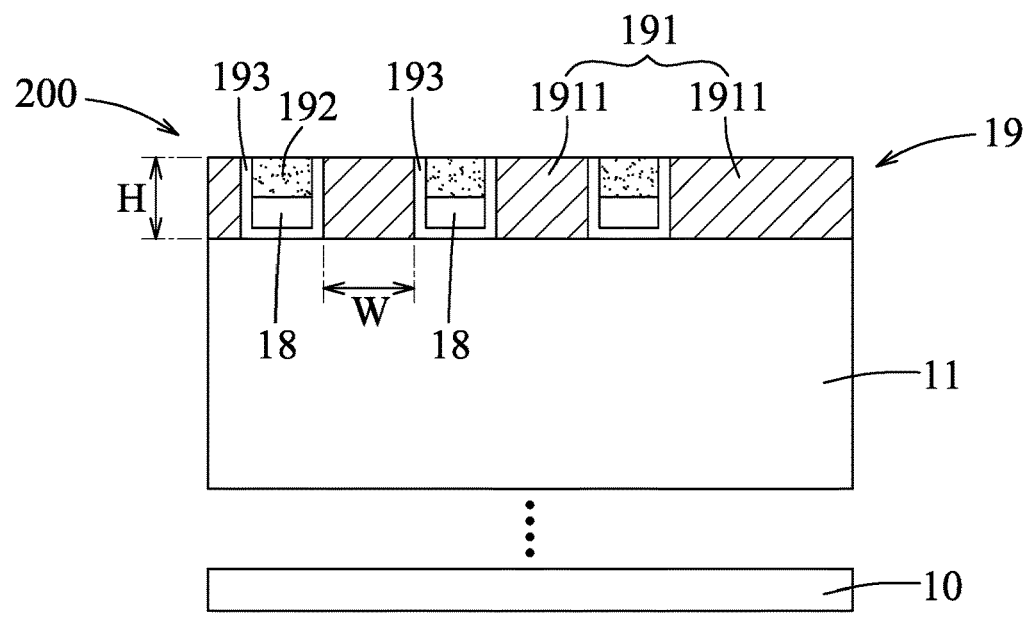

Referring to FIG. 1 and the examples illustrated in FIGS. 5 and 6, the method 100 then proceeds to step 105, where a first interconnect layer is formed. A suitable planarization process, for example, but not limited to, chemical mechanical planarization (CMP) is performed to remove a portion of the dielectric layer 17, a portion of the dielectric liner layer 16, the dielectric layer 14, the mask layer 13, and optionally a portion of the topological material layer 12 to form a first interconnect layer 19 disposed on the ILD layer 11. The first interconnect layer 19 includes an interconnect structure 191, a capping layer 192, and a plurality of dielectric liners 193. The interconnect structure 191 is formed from the topological material layer 12, and includes a plurality of conductive lines 1911 spaced apart from each other by the air gaps 18, such that the air gaps 18 (i.e., remainders of the trenches 15) are formed among the conductive lines 1911. The capping layer 192 is formed from the dielectric layer 17. Each of the dielectric liners 193 is disposed between two corresponding ones of the conductive lines 1911, and conformally covers a lateral wall of each of the two corresponding ones of the conductive lines 1911 and a portion of a top surface of the ILD layer 11, such that each of the air gaps 18 is defined by cooperation of the capping layer 192 with a corresponding one of the dielectric liners 193. Since the air gaps 18 are formed among the conductive lines 1911 to isolate the conductive lines 1911, the line-to-line capacitance and the resistance-capacitance (RC) time delay may be reduced. In some embodiments, the conductive lines 1911 have a width (W) ranging from about 1 nm to about 1000 nm, a height (H) ranging from about 1 nm to about 1000 nm, and an aspect ratio of the height (H) to the width (W) of greater than about 1:1. If the height of conductive lines 1911 made of the topological material is less than 1 nm, the topological effect on the conduction of the conductive lines 1911 may vanish. If the height of conductive lines 1911 made of the topological material is greater than 1000 nm, the resistance of the conductive lines 1911 may not be competitive compared to that of conductive lines made of metal (e.g., copper (Cu)) with the same height. In some embodiments, the aspect ratio may range from about 3:2 to about 2:1. In some embodiments, the aspect ratio may be even greater than about 2:1.

Figure 7:
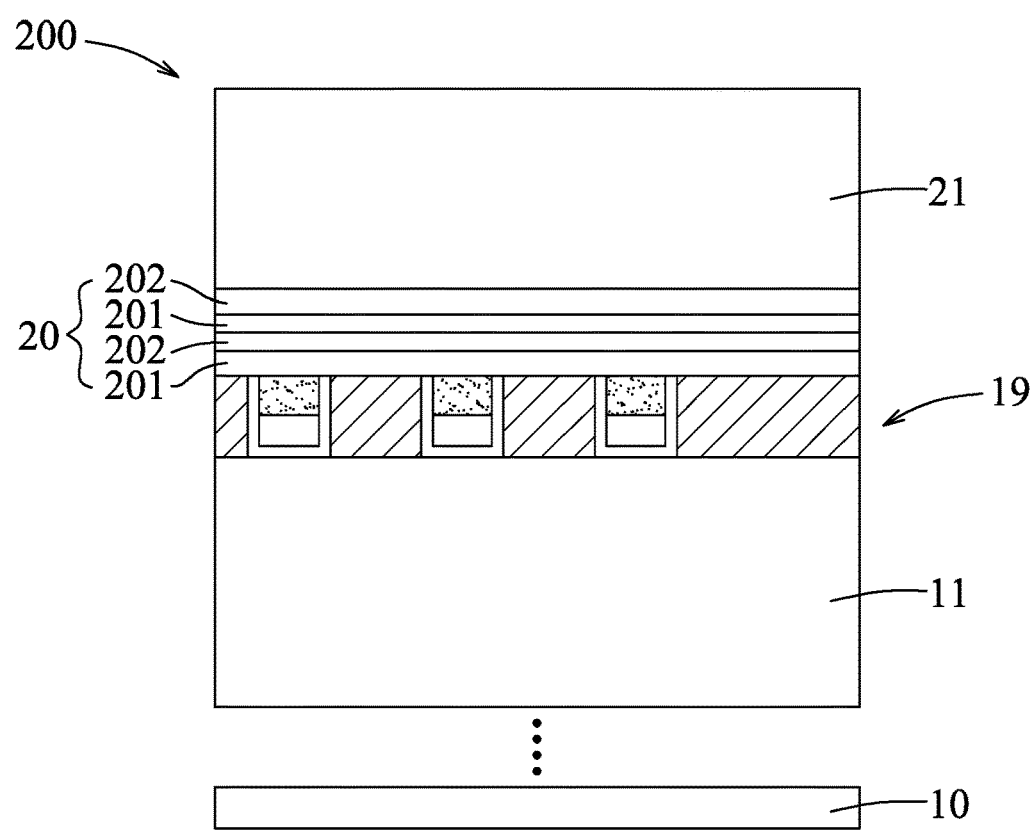

Referring to FIG. 1 and the example illustrated in FIG. 7, the method 100 then proceeds to step 106, where at least one etch stop layer and a dielectric layer are formed sequentially on the first interconnect layer. At least one etch stop layer 20 is formed on the first interconnect layer 19 by a suitable deposition process as is known in the art of semiconductor fabrication, such as PVD, CVD, ALD, PEALD, thermal ALD, PECVD, or the like. Other suitable deposition techniques are within the contemplated scope of the present disclosure. In some embodiments, the at least one etch stop layer 20 includes a stack assembly of at least one first etch stop layers 201 and at least one second etch stop layer 202 which are alternately stacked on the first interconnect layer 19. In some embodiments, the number of the at least one first etch stop layer 201 is two and the number of the at least one second etch stop layer 202 is two. In some embodiments, the number of the at least one first etch stop layer 201 is one and the number of the at least one second etch stop layer 202 is one. The first etch stop layer 201 and the second etch stop layer 202 are different from each other, and each of them may independently include silicon nitride, silicon nitride doped with carbon, silicon oxide, silicon oxynitride, silicon oxynitride doped with carbon, amorphous carbon material, silicon carbide, silicon oxycarbide, other nitride materials, other carbide materials, aluminum oxide, other metal oxides, aluminum nitride, other metal nitrides (e.g., titanium nitride, or the like), boron nitride, boron carbide, and other low-k dielectric materials or low-k dielectric materials doped with one or more of carbon, nitrogen, and hydrogen, or other suitable materials. Other suitable materials are within the contemplated scope of the present disclosure. A dielectric layer 21 is then formed on the at least one etch stop layer 20. The material and the process for forming the dielectric layer 21 may be the same as or similar to those for forming the ILD layer 11 described above with reference to FIG. 2, and the details thereof are omitted for the sake of brevity.

Figure 8:
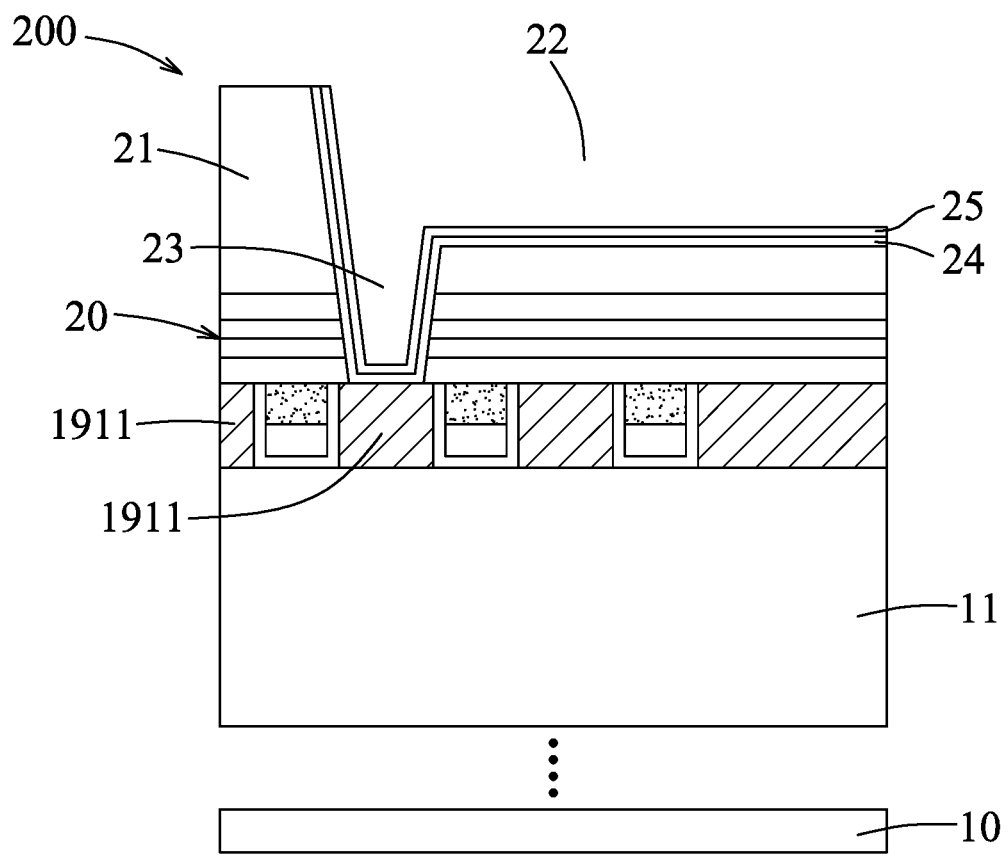
Figure 9:
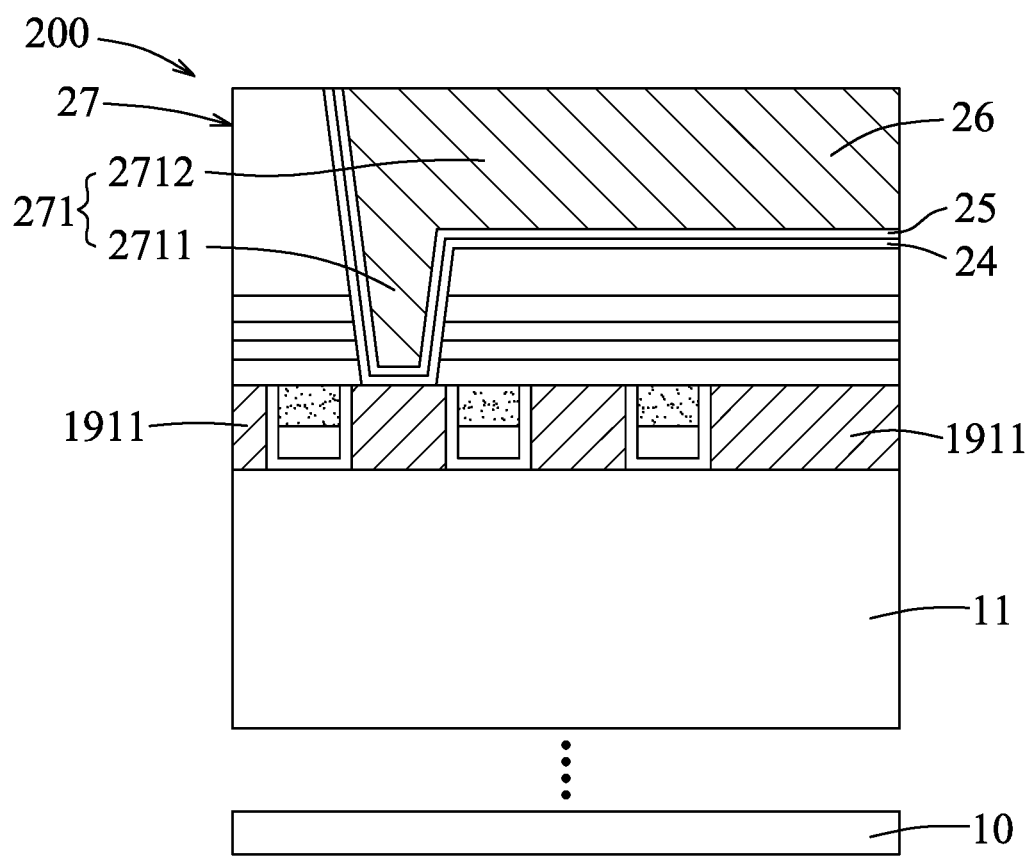

Referring to FIG. 1 and the examples illustrated in FIGS. 8 and 9, the method 100 then proceeds to step 107, where a second interconnect layer is formed. In some embodiments, a second interconnect layer 27 includes an interconnect structure 271, which includes at least one via contact 2711 and at least one metal line 2712. The at least one via contact 2711 and the at least one metal line 2712 are formed simultaneously using using a dual damascene processes.

At least one trench 22 and at least one via opening 23 are formed by patterning the dielectric layer 21 and the at least one etch stop layer 20 using one or more etching processes (for example, but not limited to, a dry etching process, a wet etching process, or a combination thereof) through a pattern of opening formed in a patterned mask layer (not shown) so as to expose at least one of the conductive lines 1911 through the at least one via opening 23 and the at least one trench 22, respectively. The at least one trench 22 is recessed downwardly from a top surface of the dielectric layer 21, and the at least one via opening 23 extends through the at least one etch stop layer 20 and is disposed below and in spatial communication with the at least one trench 22, respectively, so as to form at least one integrated opening for the at least one of the conductive lines 1911 to be exposed therethrough, respectively.

A metal barrier layer 24 is conformally formed in the at least one trench 22 and the at least one via opening 23 by a suitable deposition process as is known to those skilled in the art of semiconductor fabrication, for example, PVD, CVD, PECVD, ALD, PEALD, or the like. Other suitable deposition techniques are within the contemplated scope of the disclosure. The metal barrier layer 24 may include, for example, but not limited to, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum, tantalum nitride, tantalum silicon nitride, tantalum oxide, tantalum silicon oxide, titanium nitride, titanium silicon nitride, titanium oxide, titanium silicon oxide, or combinations thereof. Other suitable metal barrier materials are within the contemplated scope of the present disclosure.

A metal liner layer 25 is then conformally formed on the metal barrier layer 24 by a suitable deposition process as is known to those skilled in the art of semiconductor fabrication, for example, PVD, CVD, PECVD, ALD, PEALD, or the like. Other suitable deposition techniques are within the contemplated scope of the present disclosure. In some embodiments, the metal liner layer 25 may include, for example, but not limited to, metals (e.g., copper (Cu), silver (Ag), gold (Au), aluminum (Al), nickel (Ni), cobalt (Co), ruthenium (Ru), iridium (Ir), platinum (Pt), palladium (Pd), osmium (Os), tungsten (W), molybdenum (Mo), tantalum (Ta), or the like), alloys of the metals, the nitride, carbide, silicide compounds of the metals, or the like, or combinations thereof. Other suitable metal liner materials are within the contemplated scope of the present disclosure. In some embodiments, the metal liner layer 25 may have a thickness ranging from about 1 nm to about 10 nm. If the thickness is less than 1 nm, the liner properties of the metal liner layer 25 may be degraded. If the thickness is greater than 10 nm, the volume for filling a metal material to form an interconnect structure is undesirably decreased such that the conduction volume of the interconnect structure thus formed is decreased and the resistance of the interconnect structure is increased.

A metal material 26 is filled into the at least one trench 22 and the at least one via opening 23 by a suitable deposition process as is known to those skilled in the art of semiconductor fabrication, for example, selective or non-selective PVD, selective or non-selective CVD, selective or non-selective PECVD, selective or non-selective ALD, selective or non-selective PEALD, electroless deposition (ELD), electro-chemical plating (ECP), or the like, and a planarization treatment (e.g., CMP) is then performed to remove excess of the metal material 26 over the dielectric layer 21 so as to form the second interconnect layer 27 including the interconnect structure 271. The interconnect structure 271 includes the at least one via contact 2711 and the at least one metal line 2712. The at least one via contact 2711 is disposed in a lower portion of the second interconnect layer 27. The at least one metal line 2712 is disposed in an upper portion of the second interconnect layer 27, and is electrically connected to at least one of the conductive lines 1911 through the at least one via contact 2711, respectively.

In some embodiments, the metal material 26 may include, for example, but not limited to, metals (e.g., Cu, Ag, Au, Al, Ni, Co, Ru, Ir, Pt, Pd, Os, W, Mo, Ta, or the like), alloys thereof possessing promising conductive properties, or the like. Other suitable metal materials are within the contemplated scope of the present disclosure. The deposition process for forming the interconnect structure 271 may be performed at a temperature ranging from about 25° C. to about 1000° C. If the temperature of the deposition process is higher than 1000° C., the materials and the components disposed proximate to the interconnect structure 271 may be damaged.

Figure 10:
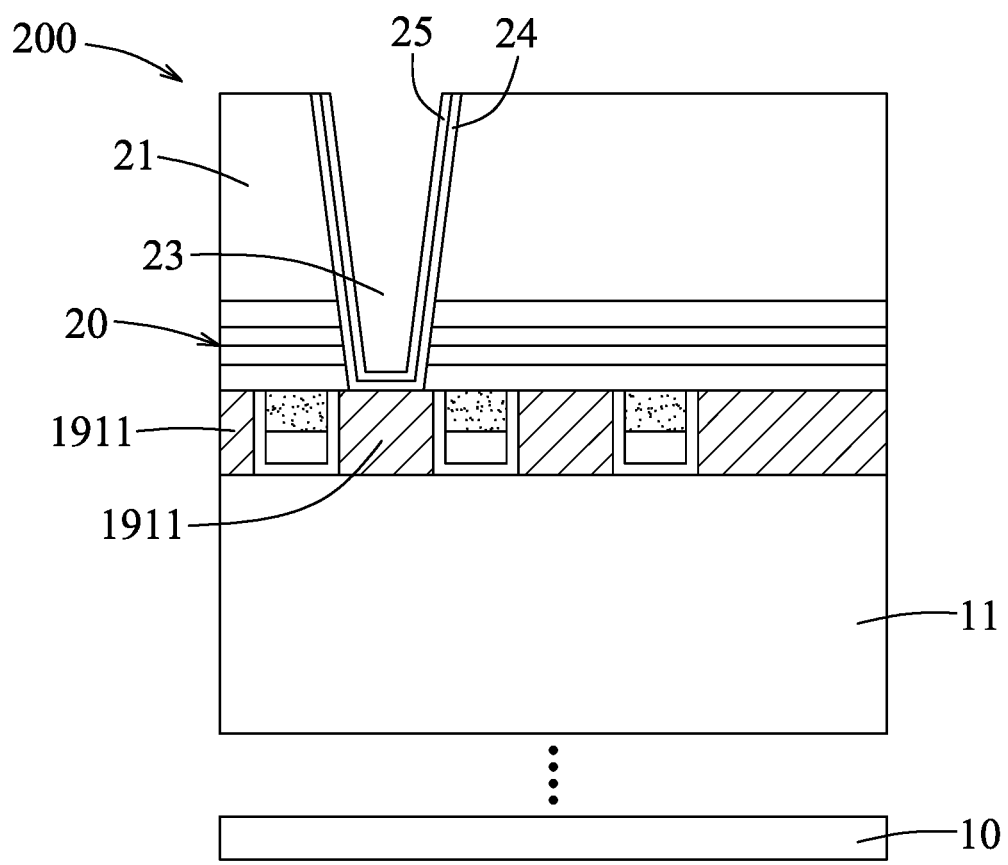
Figure 11:
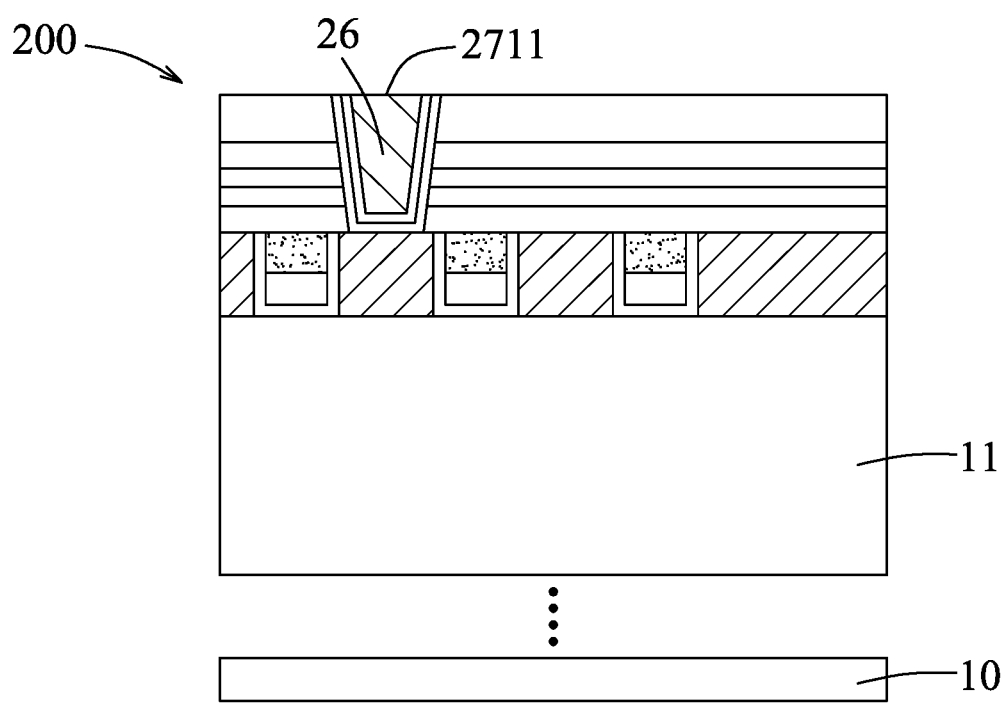
Figure 12:
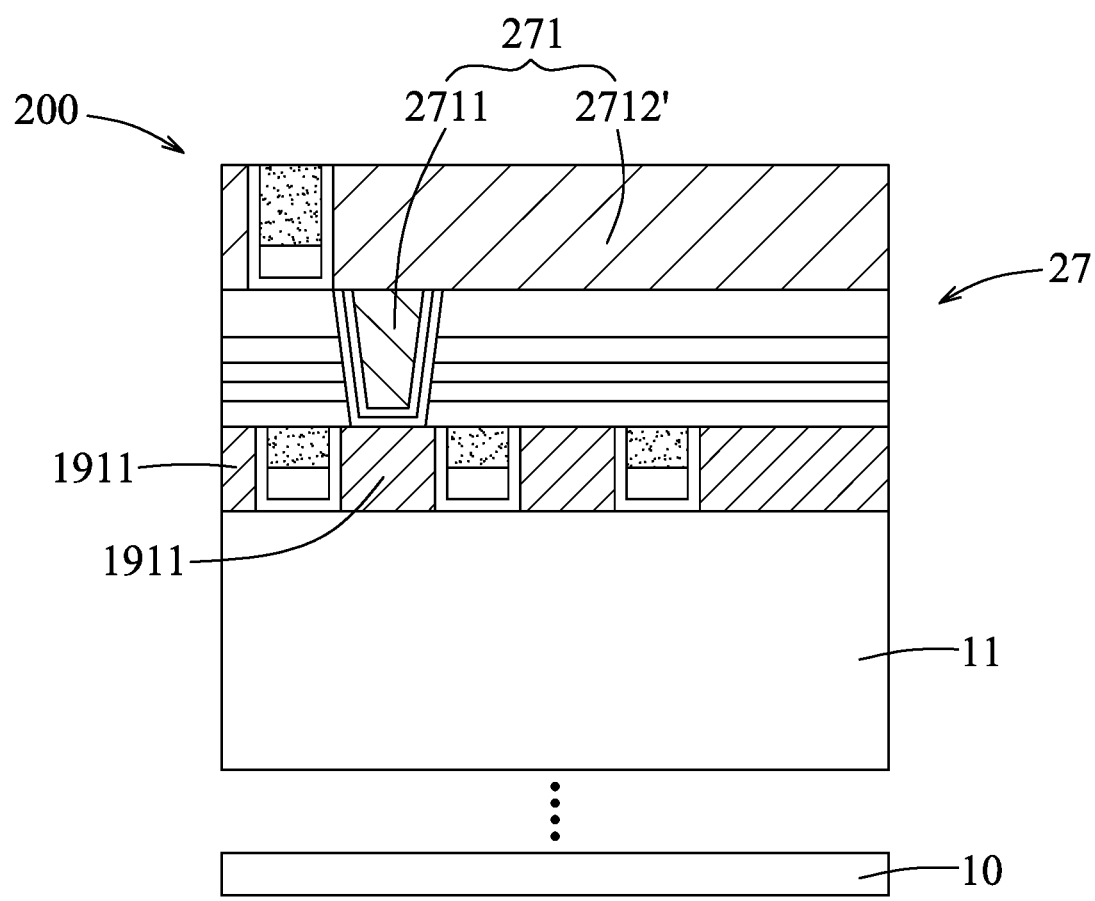

Referring to the examples illustrated in FIGS. 10 to 12, in some alternative embodiments, the interconnect structure 271 includes the at least one via contact 2711 and at least one conductive line 2712'. The at least one via contact 2711 is disposed in a lower portion of the second interconnect layer 27. The at least one conductive line 2712' is disposed in an upper portion of the second interconnect layer 27, and is electrically connected to at least one of the conductive lines 1911 through the at least one via contact 2711, respectively. The at least one via contact 2711 and the at least one conductive line 2712' are separately formed using two single damascene processes.

The at least one via opening 23 is formed by patterning the dielectric layer 21 and the at least one etch stop layer 20 using one or more etching processes (for example, a dry etching process, a wet etching process, or a combination thereof) through a pattern of opening formed in a patterned mask layer (not shown), so as to expose at least one of the conductive lines 1911 through the at least one via opening 23, respectively.

The metal barrier layer 24 is conformally formed in the at least one via opening 23, and the metal liner layer 25 is then conformally formed on the metal barrier layer 24. The materials and the processes for forming the metal barrier layer 24 and the metal liner layer 25 may be the same as or similar to those described above with reference to FIG. 8, and the details thereof are omitted for the sake of brevity.

The metal material 26 is filled into the at least one via opening 23, and a planarization treatment (e.g., CMP) is then performed to remove a portion of the metal material 26 and optionally a portion of the dielectric layer 21, a portion of the metal barrier layer 24, and a portion of the metal liner 25 so as to form the at least one via contact 2711. Examples of the metal material 26 and the process for depositing the metal material 26 may be the same as or similar to those described above with reference to FIG. 9, and the details thereof are omitted for the sake of brevity.

Formation of the at least one conductive line 2712' may be the same as or similar to those described above with reference to FIGS. 2 to 6, and the details thereof are omitted for the sake of brevity.

In some alternative embodiments, the metal material 26 is directly filled into the at least one via opening 23 without formation of the metal barrier layer 24 and the metal liner layer 25.

Figure 13:
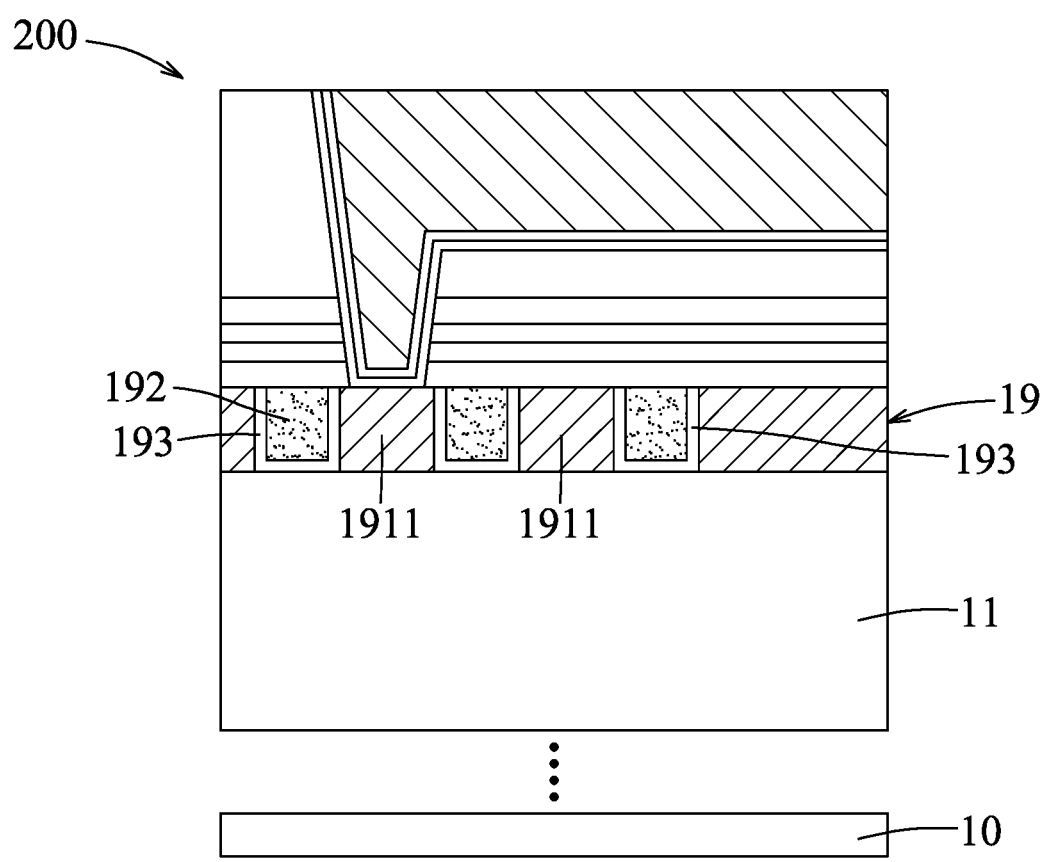
FIG. 13 is a schematic view illustrating a semiconductor device in accordance with some alternative embodiments.

Referring to the example illustrated in FIG. 13, in some alternative embodiments, the capping layer 192 is completely filled into the spaces defined by the dielectric liners 193 by completely filling the dielectric layer 17 into the trenches 15 during the stage illustrated in FIGS. 4 and 5, such that the first interconnect layer 19 is not formed with air gaps among the conductive lines 1911.

Figure 14:
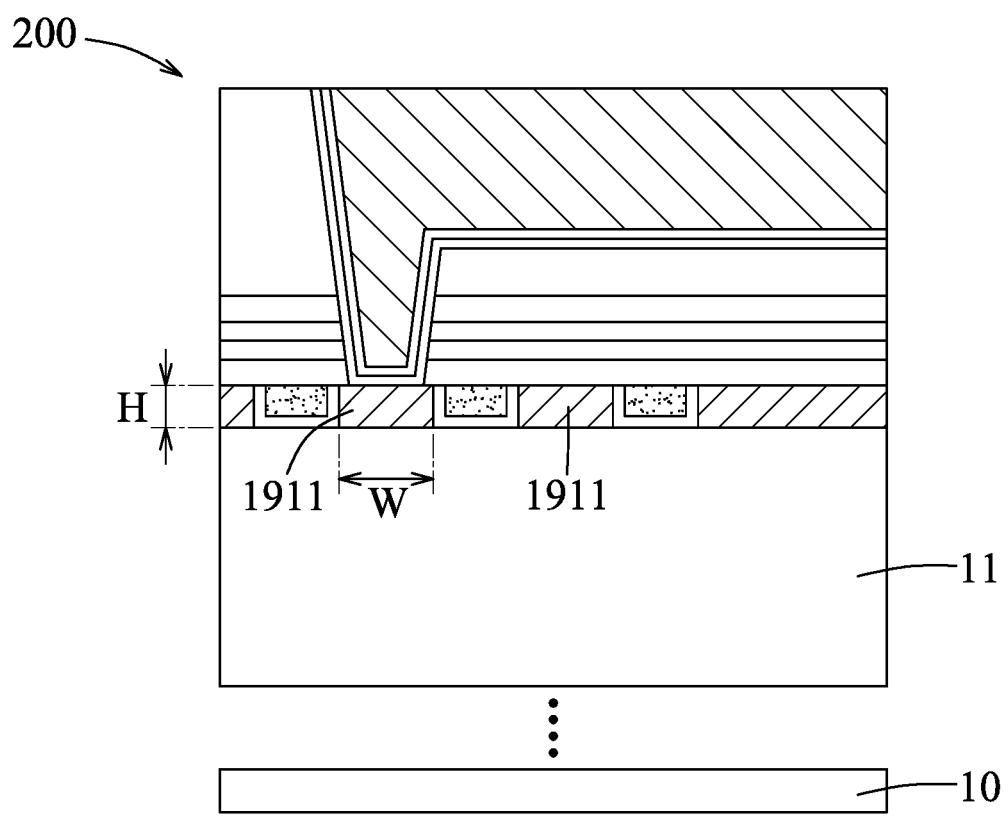
FIG. 14 is a schematic view illustrating a semiconductor device in accordance with some alternative embodiments.

Referring to the example illustrated in FIG. 14, in some alternative embodiments, the conductive lines 1911 have an aspect ratio (a ratio of height (H) to width (W)) of less than about 1:1 so as to reduce line-to-line capacitance. In some embodiments, the aspect ratio may range from about 1:2 to about 2:3. In some embodiments, the aspect ratio may be even less than about 1:2.

Figure 15:
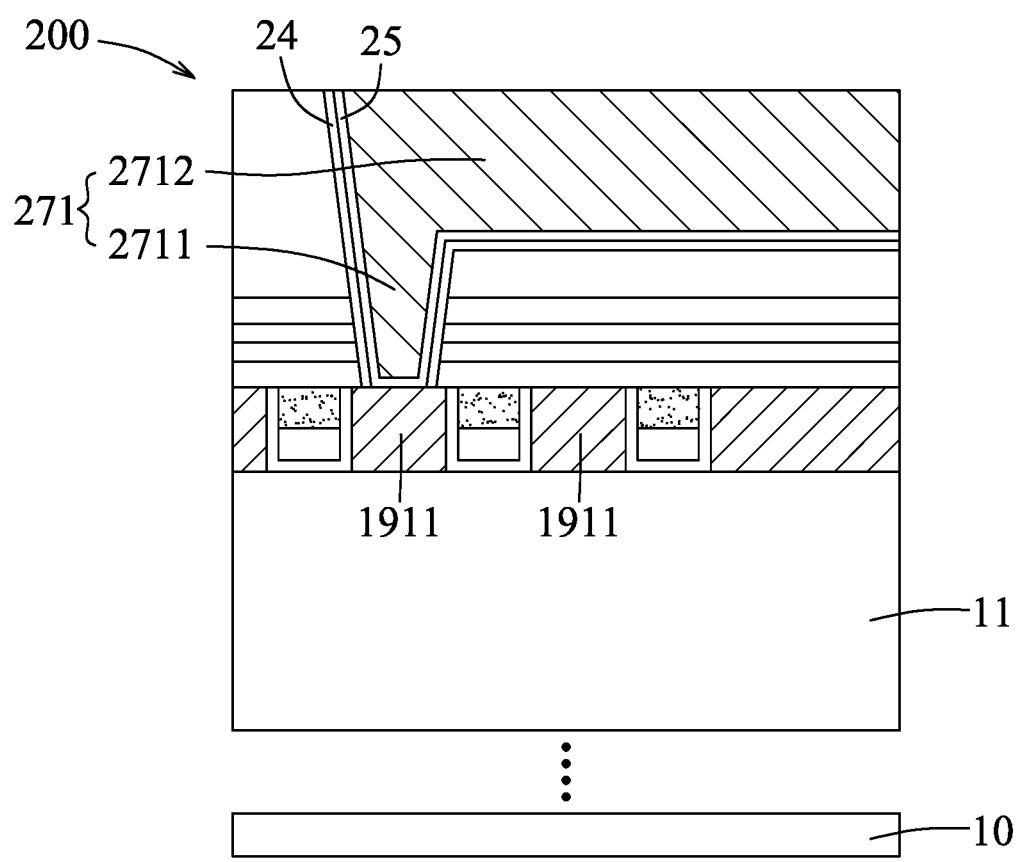
FIG. 15 is a schematic view illustrating a semiconductor device in accordance with some alternative embodiments.

Referring to the example illustrated in FIG. 15, in some alternative embodiments, the metal barrier layer 24 is conformally formed in the at least one trench 22 and the at least one via opening 23 by a suitable selective deposition process as is known to those skilled in the art of semiconductor fabrication, for example, selective PVD, selective CVD, selective ALD, selective ELD, or the like, such that an opening is formed at a bottom of the metal barrier layer 24. Other suitable deposition techniques are within the contemplated scope of the present disclosure. Since the at least one via contact 2711 of the interconnect structure 271 thus formed does not include the metal barrier layer 24 at a bottom thereof, the contact resistance between the at least one via contact 2711 and at least one of the conductive lines 1911 may be reduced.

Figure 16:
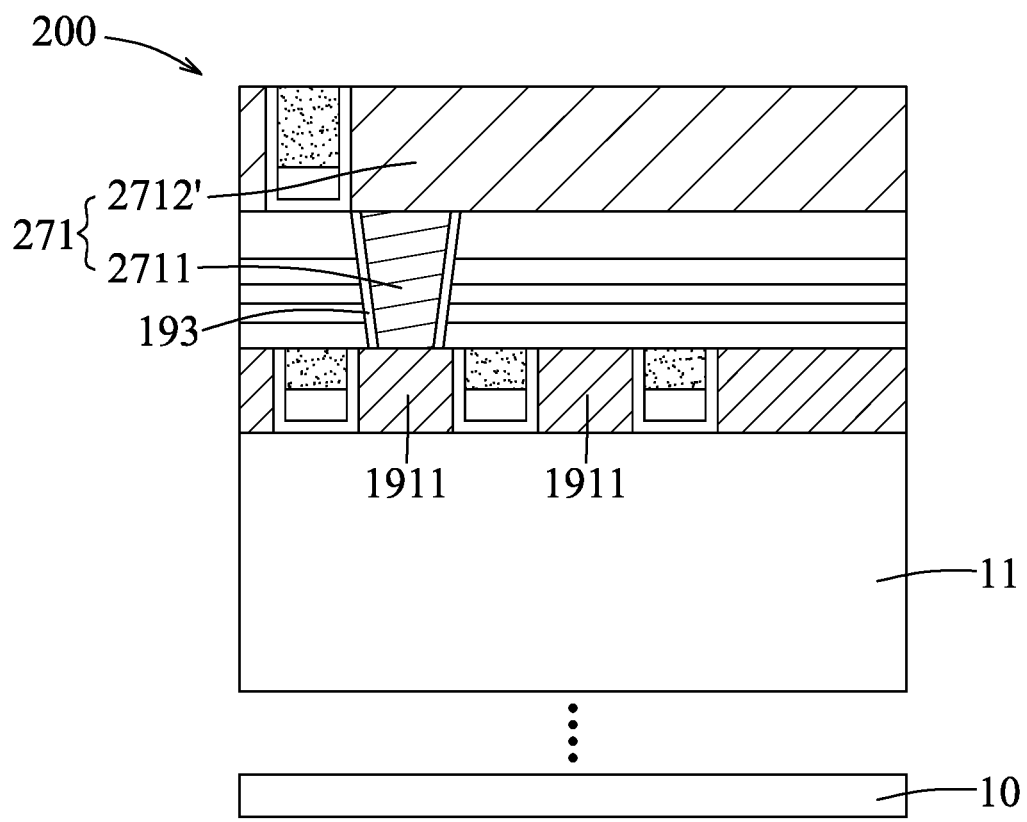
FIG. 16 is a schematic view illustrating a semiconductor device in accordance with some alternative embodiments.

Referring to the example illustrated in FIG. 16, in some alternative embodiments, the interconnect structure 271 includes the at least one via contact 2711 and the at least one conductive line 2712' electrically connected to at least one of the conductive lines 1911 through the at least one via contact 2711, respectively. The at least one via contact 2711 and the at least one conductive line 2712' may be separately formed using two single damascene processes. The at least one via contact 2711 includes the topological material, and is laterally covered by the dielectric liner 193. The dielectric liner 193 is formed by a suitable selective deposition process as is known to those skilled in the art of semiconductor fabrication, for example, selective PVD, selective CVD, selective ALD, selective ELD, or the like, such that an opening is formed at a bottom of the dielectric liner 193, and such that the at least one via contact 2711 made of the topological material is electrically connected to at least one of the conductive lines 1911, respectively. Other suitable deposition techniques are within the contemplated scope of the present disclosure.

In the semiconductor device of the present disclosure, the topological material is applied to form an interconnect structure based on the exotic transport property thereof. The interconnect structure in a three-dimensional configuration including the topological material possesses an exotic surface state, which provides a two-dimensional like conduction similar to the conduction of graphene. In addition, the topological material has an exotic three-dimensional conduction nature, such that the interconnect structure in the three-dimensional configuration including the topological material does not suffer a high contact resistance, unlike the contact resistance of a two-dimensional material (e.g., graphene) resulting from a slow out-of-plan transport property. The interconnect structure including the topological material has a low contact resistance to metal lines and/or via contacts. Therefore, when an interconnect structure is scaled down, the interconnect structure including the topological material may have a relatively low line resistance compared with that of the interconnect structure made of metal (e.g., copper). Furthermore, when the interconnect structure including the topological material is integrated with air gaps formed among the conductive lines of the interconnect structure, the line-to-line capacitance of the interconnect structure may be reduced and the RC time delay may be reduced accordingly. Moreover, when the aspect ratio (a ratio of height to width) of the conductive lines of the interconnect structure including the topological material is lowered, the line-to-line capacitance of the interconnect structure may also be reduced and the RC time delay may be reduced accordingly.

In accordance with some embodiments of the present disclosure, a semiconductor device includes a substrate and an interconnect layer disposed over the substrate. The interconnect layer includes an interconnect structure which includes a topological material.

In accordance with some embodiments of the present disclosure, the topological material includes a topological insulator, a topological semimetal, or a combination thereof.

In accordance with some embodiments of the present disclosure, the interconnect structure further includes a magnetic material.

In accordance with some embodiments of the present disclosure, the interconnect structure includes a via contact disposed in a lower portion of the interconnect layer, and a conductive line disposed in an upper portion of the interconnect layer and electrically connected to the via contact. At least one of the via contact and the conductive line includes the topological material.

In accordance with some embodiments of the present disclosure, both the via contact and the conductive line include the topological material.

In accordance with some embodiments of the present disclosure, the interconnect layer further includes a dielectric liner laterally covering the via contact.

In accordance with some embodiments of the present disclosure, the interconnect structure includes a first conductive line and a second conductive line which are spaced apart from each other to form a trench therebetween and which include the topological material. The interconnect layer further includes a dielectric liner which is disposed in the trench and between the first and second conductive lines and which conformally covers a lateral wall of each of the first and second conductive lines, and a capping layer disposed in the trench.

In accordance with some embodiments of the present disclosure, the dielectric liner cooperates with the capping layer to define an air gap.

In accordance with some embodiments of the present disclosure, the conductive lines have an aspect ratio of height to width of less than 1:1.

In accordance with some embodiments of the present disclosure, the conductive lines have an aspect ratio of height to width of less than 1:1.

In accordance with some embodiments of the present disclosure, a semiconductor device includes a substrate, a first interconnect layer, and a second interconnect layer. The first interconnect layer is disposed over the substrate, and includes a first interconnect structure containing a first topological material. The second interconnect layer is disposed on the first interconnect layer, and includes a second interconnect structure which includes a via contact disposed in a lower portion of the second interconnect layer and a conductive line disposed in an upper portion of the second interconnect layer and electrically connected to the first interconnect structure through the via contact. At least one of the via contact and the conductive line include a second topological material.

In accordance with some embodiments of the present disclosure, each of the first and second topological materials independently includes a topological insulator, a topological semimetal, or a combination thereof.

In accordance with some embodiments of the present disclosure, both the via contact and the conductive line include the second topological material.

In accordance with some embodiments of the present disclosure, the first interconnect structure includes a first conductive line and a second conductive line which are spaced apart from each other to form a first trench therebetween and one of which is electrically connected to the conductive line of the second interconnect structure through the via contact. The first interconnect layer further includes a dielectric liner which is disposed in the first trench and between the first and second conductive lines and which conformally covers a lateral wall of each of the first and second conductive lines, and a capping layer disposed in the first trench.

In accordance with some embodiments of the present disclosure, the dielectric liner cooperates with the capping layer to define an air gap.

In accordance with some embodiments of the present disclosure, the second interconnect structure includes two of the conductive lines which are spaced apart from each other to form a second trench therebetween, and one of which is electrically connected to a corresponding one of the first and second conductive lines of the first interconnect structure through the via contact. The second interconnect layer further includes a first dielectric liner, a second dielectric liner, and a capping layer. The first dielectric liner laterally covers the via contact. The second dielectric liner is disposed in the second trench and between the two conductive lines of the second interconnect structure, and conformally covers a lateral wall of each of the two conductive lines of the second interconnect structure. The capping layer is disposed in the second trench.

In accordance with some embodiments of the present disclosure, a method for manufacturing a semiconductor device includes forming a topological material layer over a substrate; patterning the topological material layer to form a trench in the topological material layer; conformally forming a dielectric liner in the trench; and filling a capping layer into the trench to form a first interconnect layer including a first interconnect structure formed from the topological material layer.

In accordance with some embodiments of the present disclosure, the method for manufacturing a semiconductor device further includes forming at least one etch stop layer on the first interconnect layer; forming a dielectric layer on the at least one etch stop layer; and forming a second interconnect structure which extends through the dielectric layer and the at least one etch stop layer and which includes a via contact and a conductive line electrically connected to the first interconnect structure through the via contact, at least one of the via contact and the conductive line including a topological material.

In accordance with some embodiments of the present disclosure, one of the via contact and the conductive line is made of the topological material, and the other one of the via contact and the conductive line is made of a metal material. The via contact and the conductive line are formed separately using two single damascene processes.

In accordance with some embodiments of the present disclosure, both the via contact and the conductive line are made of the topological material. The via contact and the conductive line are formed simultaneously using a dual damascene processes.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate; and
   an interconnect layer disposed over the substrate and including an interconnect structure, the interconnect structure including a topological material,
   wherein
   the interconnect structure includes a first conductive line and a second conductive line which are spaced apart from each other to form a trench between the first conductive line and the second conductive line and which include the topological material;
   the interconnect layer further includes a first dielectric liner which is disposed in the trench and between the first conductive line and the second conductive line and which conformally covers a lateral wall of each of the first conductive line and the second conductive line, and a capping layer disposed in the trench; and
   the first dielectric liner cooperates with the capping layer to define an air gap.

2. The semiconductor device according to claim 1, wherein the topological material includes a topological insulator, a topological semimetal, or a combination thereof.

3. The semiconductor device according to claim 1, wherein the interconnect structure further includes a magnetic material.

4. The semiconductor device according to claim 1, wherein the interconnect structure further includes:
a via contact disposed on a corresponding one of the first conductive line and the second conductive line, and
a conductive line disposed on and electrically connected to the via contact,
at least one of the via contact and the conductive line including the topological material.

5. The semiconductor device according to claim 4, wherein both the via contact and the conductive line include the topological material.

6. The semiconductor device according to claim 5, wherein the interconnect layer further includes a second dielectric liner laterally covering the via contact.

7. The semiconductor device according to claim 1, wherein each of the first conductive line and the second conductive line has an aspect ratio of height to width of greater than 1:1.

8. The semiconductor device according to claim 1, wherein each of the first conductive line and the second conductive line has an aspect ratio of height to width of less than 1:1.

9. A semiconductor device comprising:
a substrate;
a first interconnect layer disposed over the substrate, and including a first interconnect structure containing a first topological material; and
a second interconnect layer disposed on the first interconnect layer, and including a second interconnect structure which includes a via contact disposed in an lower portion of the second interconnect layer and a first conductive line disposed in an upper portion of the second interconnect layer and electrically connected to the first interconnect structure through the via contact,
at least one of the via contact and the first conductive line including a second topological material.

10. The semiconductor device according to claim 9, wherein each of the first topological material and the second topological material independently includes a topological insulator, a topological semimetal, or a combination thereof.

11. The semiconductor device according to claim 9, wherein both the via contact and the first conductive line include the second topological material.

12. The semiconductor device according to claim 11, wherein
the first interconnect structure includes a first conductive line and a second conductive line which are spaced apart from each other to form a first trench between the first conductive line and the second conductive line of the first interconnect structure and one of which is electrically connected to the first conductive line of the second interconnect structure through the via contact; and
the first interconnect layer further includes a dielectric liner which is disposed in the first trench and between the first conductive line and the second conductive line of the first interconnect structure and which conformally covers a lateral wall of each of the first conductive line and the second conductive line of the first interconnect structure, and a capping layer disposed in the first trench.

13. The semiconductor device according to claim 12, wherein the dielectric liner cooperates with the capping layer to define an air gap.

14. The semiconductor device according to claim 12, wherein
the second interconnect structure further includes a second conductive line which is spaced apart from the first conductive line of the second interconnect structure to form a second trench between the first conductive line and the second conductive line of the second interconnect structure; and
the second interconnect layer further includes
a first dielectric liner laterally covering the via contact,
a second dielectric liner which is disposed in the second trench and between the first conductive line and the second conductive line of the second interconnect structure and which conformally covers a lateral wall of each of the first conductive line and the second conductive line of the second interconnect structure, and
a capping layer disposed in the second trench.

15. A semiconductor device comprising:
a substrate;
a dielectric layer disposed over the substrate; and
an interconnect layer disposed on the dielectric layer, and including an interconnect structure and a dielectric liner in contact with the dielectric layer and laterally covering the interconnect structure, the interconnect structure including a topological material which includes a topological insulator, a topological semimetal, or a combination thereof,
wherein the interconnect layer further includes a capping layer cooperating with the dielectric liner to define an air gap.

16. The semiconductor device according to claim 15, wherein the topological insulator includes bismuth telluride, antimony telluride, bismuth-antimony alloy, bismuth selenide, or combinations thereof.

17. The semiconductor device according to claim 15, wherein the topological semimetal includes niobium phosphide, tantalum arsenide, niobium arsenide, tantalum phosphide, tungsten ditelluride, molybdenum ditelluride, tungsten diphosphide, molybdenum diphosphide, cadmium arsenide, platinum stannide, lanthanum antimonide, lanthanum bismuthide, platinum bismuthide), zirconium pentatelluride, hafnium pentatelluride, lead tantalum selenide, zirconium silicon sulfide, hafnium silicide sulfide, niobium arsenide, tantalum arsenide, or combinations thereof.

18. The semiconductor device according to claim 15, wherein the interconnect structure further includes a magnetic material, which includes cobalt, iron, nickel, or combinations thereof.

19. The semiconductor device according to claim 15, wherein the dielectric liner includes a base portion in contact with the dielectric layer, and a wall portion extending from the base portion and laterally covering the interconnect structure.

20. The semiconductor device according to claim 19, wherein the capping layer is in contact with an upper part of the wall portion of the dielectric liner.

* * * * *